United States Patent
Ng et al.

(10) Patent No.: US 10,568,229 B1
(45) Date of Patent: Feb. 18, 2020

(54) SERVER STRUCTURE

(71) Applicant: Super Micro Computer Inc., San Jose, CA (US)

(72) Inventors: Pae Yoong Ng, San Jose, CA (US); Pak Kai Ho, San Jose, CA (US)

(73) Assignee: SUPER MICRO COMPUTER INC., San Jose, CA (US)

( * ) Notice: Subject to any disclaimer, the term of this patent is extended or adjusted under 35 U.S.C. 154(b) by 0 days.

(21) Appl. No.: 16/232,991

(22) Filed: Dec. 26, 2018

(51) Int. Cl.
| H05K 7/20 | (2006.01) |
| H05K 7/14 | (2006.01) |
| H05K 5/00 | (2006.01) |
| H05K 5/03 | (2006.01) |
| F28F 13/00 | (2006.01) |
| H05K 5/02 | (2006.01) |

(52) U.S. Cl.
CPC ........... *H05K 7/1487* (2013.01); *F28F 13/00* (2013.01); *H05K 5/0026* (2013.01); *H05K 5/0221* (2013.01); *H05K 5/03* (2013.01); *H05K 7/1405* (2013.01); *H05K 7/1489* (2013.01); *H05K 7/20409* (2013.01)

(58) Field of Classification Search
None
See application file for complete search history.

(56) References Cited

U.S. PATENT DOCUMENTS

| 7,342,786 B2* | 3/2008 | Malone ............. | H05K 7/20727 165/104.33 |
| 7,403,387 B2* | 7/2008 | Pav .......................... | G06F 1/20 361/694 |
| 7,474,528 B1* | 1/2009 | Olesiewicz ........ | H05K 7/20154 361/694 |
| 8,638,554 B2* | 1/2014 | Wei .................... | H05K 7/20727 165/80.3 |
| 8,675,365 B2* | 3/2014 | Pav ......................... | G06F 1/206 165/122 |
| 9,417,671 B2* | 8/2016 | Farrow ..................... | G06F 1/20 |
| 2005/0122703 A1* | 6/2005 | Fan ...................... | H05K 7/1408 361/801 |
| 2005/0219813 A1* | 10/2005 | Cravens .................... | G06F 1/20 361/690 |
| 2007/0236882 A1* | 10/2007 | Chen .................. | H05K 7/20154 361/695 |
| 2016/0262286 A1* | 9/2016 | Lin .................... | H05K 7/20145 |

* cited by examiner

*Primary Examiner* — Courtney L Smith
(74) *Attorney, Agent, or Firm* — Chun-Ming Shih; HDLS IPR Services

(57) ABSTRACT

A server structure having a tray, a mother board, a computing device, a computing device, a plurality of slot connectors and an air shroud is provided. The mother board is stacked on the tray, and a top surface of the mother board is exposed. The computing device is arranged on the top surface of the mother board and electrically connected to the mother board. The slot connectors are arranged on the top surface of the mother board and arranged in parallel and at intervals, and the slot connectors is arranged adjacent to the computing device. The air shroud covers on the slot connectors and an external surface of the air shroud is extended toward the computing device to guide air to flow toward the computing device. Therefore, air flows through a primary heat source, the computing device namely.

9 Claims, 5 Drawing Sheets

SERVER STRUCTURE

TECHNICAL FIELD

The present disclosure relates to a server, and more particularly to a server structure having air shrouds.

BACKGROUND

For conventional server computers, a lot of electronic components are arranged within, and the respective working electronic components generate heat when the server computer is operated. According to the various power consumptions of the respective electronic components, heat generation of the respective electronic components are different from each other. Therefore, a heat dissipation arrangement should be designed according to the primary heat source. According to a conventional arrangement of force convection heat dissipation, a fan is provided for sucking air from the environment and blowing into the server computer. When the air is blown through the respective electronic components, the heat is exchanged and removed from the respective electronic components, and the heat is further exhausted from the server computer. However, in order to inlet a maximum air flux, the fan generally should be arranged on a chassis of the server computer, and the fan is therefore limited to specific areas. According to a drawer type server computer, rails are arranged at two sides of the server computer, a top and a bottom of the server computer are accommodated in a rack, and the fan can therefore only be arranged at a front side or a rear side of the drawer.

Accordingly, the fan is limited in specific locations and the fan generally cannot be arranged corresponding to the primary heat source. A poor efficiency of thermal exchange is caused by a random flow field in the server computer of the air introduced by the fan, and disposing an air channel structure disposed between the fan and the primary heat source is a conventional solution for guiding the introduced airflow past the primary heat source. However, the air channel structure should provide a channel communicated between the fan and the primary heat source, the arrangement thereof should bypass other existing structures, and an airflow field should be also considered. Therefore, the air channel structure is difficult to design. Another conventional solution is arranging a heat transferring component, such as a heat pipe, between the fan and the primary heat source, so it is not necessary to consider an airflow field. However, the heat transferring component should still be arranged to bypass other existing structures. Moreover, cost of the heat transferring component is higher than the air channel structure.

In view of these issues, in order to solve the above disadvantage, the present inventor has studied related technology and provides a reasonable and effective solution in the present disclosure.

SUMMARY

A server structure having air shrouds is provided in the present disclosure.

A server structure having a tray, a mother board, a computing device, a computing device, a plurality of slot connectors and an air shroud is provided in the present disclosure. The mother board is stacked on the tray, and a top surface of the mother board is exposed. The computing device is arranged on the top surface of the mother board and electrically connected to the mother board. The slot connectors are arranged on the top surface of the mother board and arranged in parallel and at intervals, and the slot connectors is arranged adjacent to the computing device. The air shroud covers on the slot connectors and an external surface of the air shroud is extended toward the computing device to guide air to flow toward the computing device.

According to the server structure of the present disclosure, the air shroud has a rectangular top plate and has a couple of top plates and a couple of end plates respectively arranged perpendicular to the rectangular top plate, the couple of end plates and the couple of side plates are connected to the respectively edges of the top plate, the couple of end plates are arranged opposite to each other and the couple of side plates are arranged opposite to each other, an opening opposite to the top plate is enclosed among the couple of end plates and the couple of side plates, and the slot connectors are accommodated in the opening.

According to the server structure of the present disclosure, an elastic hook is arranged protruding from an internal surface of each of the couple of end plates, a latch is arranged on each of two ends of each slot connector, and the elastic hook hooks the respective latches.

According to the server structure of the present disclosure, an elastic hook is arranged protruding from an internal surface of one of the side plates, and elastic hook hooks an edge of the mother board. The elastic hook is reversed and extended from an edge of the side plate, a tip of the elastic hook penetrates and hooks the side plate, and the tip of the elastic hook hooks a side wall of the tray. The slot connectors are separated from the computing device by the other side plate.

According to the server structure of the present disclosure, a notch is defined on each of the couple of end plates of the air shroud, and the respective notches are arranged corresponding to the two ends of the respective slot connectors. The elastic hook is reversed and extended from an internal edge of the notch, a tip of the elastic hook penetrates and hooks the side plate, and a middle segment of the elastic hook hooks the respective connectors.

According to the server structure of the present disclosure, at least one slot is defined on an edge of each notch, the slots are disposed corresponding to gaps between the adjacent slot connectors, an elastic hook is arranged protruding from an internal surface of each of the couple of end plates, a latch is arranged on each of two ends of each slot connector, the elastic hook hooks the respective latches, and each slot extends to the elastic hook.

According to the server structure of the present disclosure, a heat dissipation block thermal connected with the computing device is arranged on the mother board, the heat dissipation block comprises a plurality of fins arranged in parallel and at intervals, and the fins are arranged parallel with the slot connectors.

According to the server structure of the present disclosure, the respective slot connectors are arranged at two opposite sides of the computing device, a couple of air shrouds are respectively arranged at the two opposite sides of the computing device corresponding to the slot connectors, and an air channel extended to the computing device is defined in a space enclosed between the air shrouds.

According to the server structure of the present disclosure, the air shroud covers the slot connector and thereby avoids airflow from flowing through the slot connector, and the airflow therefore flows together and through, a primary heat source, the computing device namely. Accordingly, the air shroud avoids airflow from flowing through electronic component generating less heat, an air channel extending to the computing device is defined in a space between the air shrouds, and airflow therefore flows together and through a primary heat source. Structure of the air shroud is simple, and the air shroud are arranged separated from each other corresponding to individual electronic components. It is not necessary to bypass other exist components, the present disclosure is adapted limited spaces and various arrangement of components, and structure of the present disclosure is simple.

BRIEF DESCRIPTION OF DRAWING

The present disclosure can be more fully understood by reading the following detailed description of the embodiment, with reference made to the accompanying drawings as follows.

DETAILED DESCRIPTION

Figure 1:
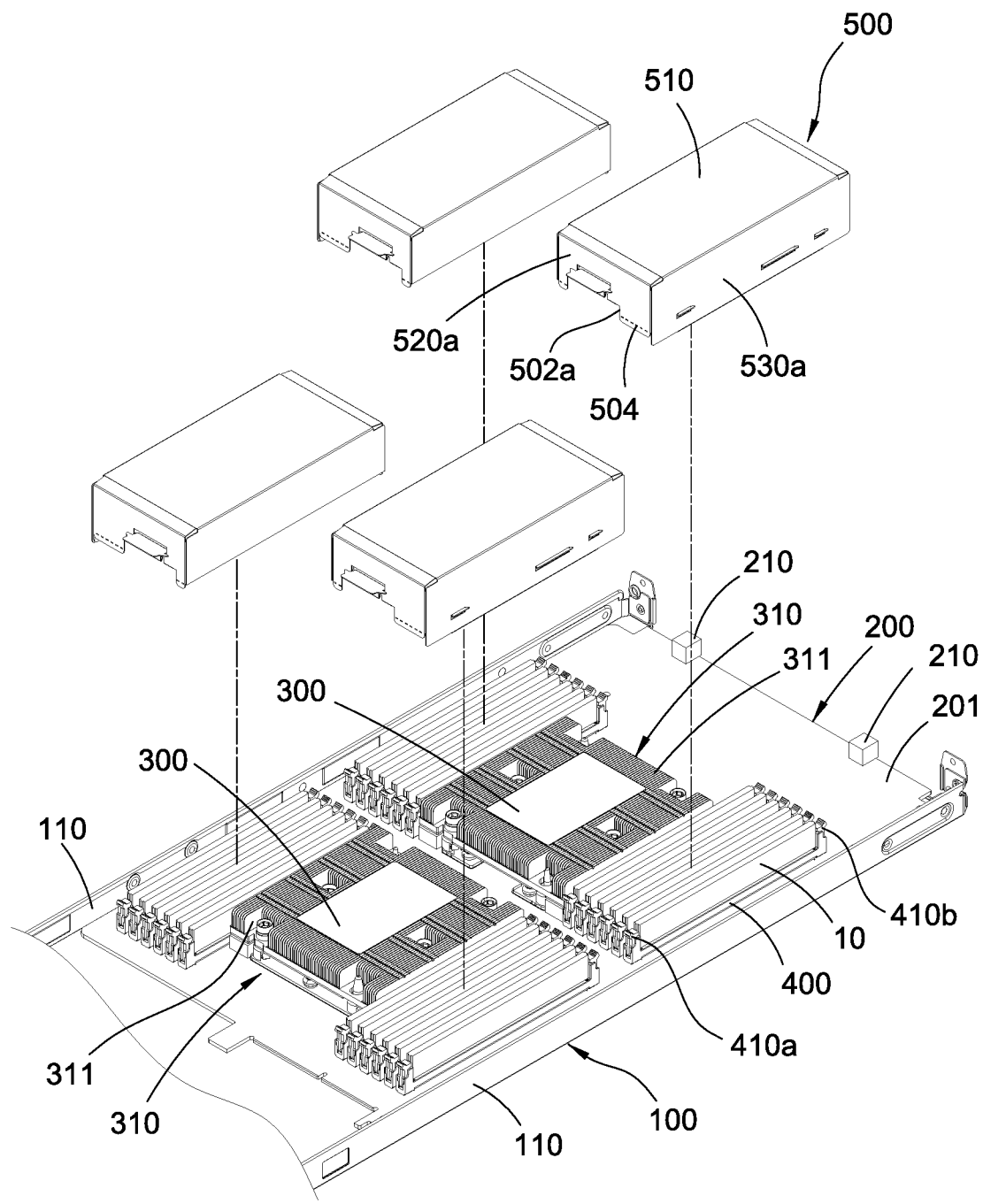
FIG. 1 is an exploded view showing the server structure according to the embodiment of the present disclosure.

According to FIGS. 1 to 4, a server structure has a tray 100, a mother board 200, at least one computing device 300, a plurality of slot connectors 400 and at least one air shroud 500 arranged corresponding to the slot connector 400 provided in an embodiment of the present disclosure. The slot connectors 400 are preferably DIMM (dual in-line memory module) sockets according to the present embodiment.

According to the present embodiment, the tray 100 is preferably a drawer structure: rails (not shown) are allowed to be respectively arranged on external surfaces of a couple of side walls 110 thereof and the tray 100 is thereby arranged in a rack (not shown). Therefore, a fan (not shown) arranged in the tray 100 could drive air to flow parallel to and between the couple of side walls 110. The mother board 200 is stacked on the tray 100, and the mother board 200 is exposed through a top surface 201. At least one connector 210 is arranged at a side edge of the mother board 200 and the connector 210 is exposed at a side of the tray 100 for coupling with a circuit board (not shown) in the rack.

The computing device 300 is arranged on the top surface 201 of the mother board 200 and electrically connected with the mother board 200. According to the present embodiment, two of the same computing devices 300 are preferably arranged on the top surface 201 of the mother board 200. According to a requirement corresponding to the number of arrangement of the computing devices 300, the scope of the present disclosure should not be limited to the embodiment. The following description is only directed to one of the computing devices 300 below, and the other computing device 300 has the same structure and will not be repeated. At least one heat dissipation block 310 thermal connected with the respective computing device 300 is arranged on the top surface 201 of the mother board 200 corresponding to the computing devices 300. According to the present embodiment, a heat dissipation block 310 is preferably arranged on the top surface 201 the mother board 200 corresponding to each computing devices 300, and the respective heat dissipation blocks 310 are arranged surrounding and contacting with the respective corresponding computing devices 300. The respective heat dissipation blocks 310 have the same structure as each other. Each heat dissipation block 310 has a plurality of fins 311 arranged in parallel, and each fin 311 is arranged parallel with the side wall 110.

According to FIGS. 1, 2, 5 and 6, the slot connectors 400 are arranged in parallel and at intervals on the top surface 201 of the mother board 200 and respectively electrically connected with the mother board 200. The slot connectors 400 are arranged adjacent to the computing device 300, and the fins 311 are arranged in parallel with the slot connector 400. Each slot connector 400 is allowed an extension card 10 (e.g. DIMM memory) inserted therein. A latch 410a/410b is pivotally connected at each of two ends of the slot connector 400, with each latch 410a/410b pivotable and thereby able to selectively buckle the extension card 10 or release the extension card 10, and internal edges of the couple of latches 410a/410b are arranged opposite to each other when the couple of latches 410a/410b buckle the extension card 10. According to the present embodiment, four groups of slot connectors 400 are arranged on the mother board 200 and are separated from each other. The same arrangements are disposed in the respective groups, and each group has six slot connectors 400 arranged separated from each other and in parallel. However, according to the present disclosure, the number of the slot connectors 400 in the respective groups should not be limited to the embodiment.

The air shroud 500 covers the slot connectors 400 and an external surface of the air shroud 500 is extended toward the computing device 300. Airflow is thereby guided to flow to the computing device. According to the present embodiment, four of the same wind shields 500 are arranged corresponding to the respective slot connector 400, and the four wind shields 500 respectively cover all slot connectors 400 of each group. An air channel extending to the computing device 300 is enclosed among the four air shrouds 500 by the respective external surface of the four air shrouds 500, and a fan could be arranged in the air channel for driving air to flow. Each air shroud 500 is formed by a folded insulation plastic sheet (mylar). The air shroud 500 has a rectangular top plate 510, a couple of end plates 520a/520b and a couple of side plates 530a/530b. The couple of end plates 520a/520b and the couple of side plates 530a/530b are extended from respective edges of the top plate 510 and respectively folded toward and perpendicular to the same surface of the rectangular top plate 510. The couple of end plates 520a/520b are arranged opposite to each other and the couple of side plates 530a/530b are arranged opposite to each other, and an opening 501 opposite to the rectangular top plate 510 is enclosed among the couple of end plates 520a/520b and the couple of side plates 530a/530b, and the slot connectors 400 are accommodated in the opening 501.

An elastic hook 541a/541b is arranged protruding from an internal surface of each of the couple of end plates 520a/520b, a latch 410a/410b is pivoted on each of two ends of each slot connector 400, and each elastic hook 541a/541b hooks an external edge of the respective latch 410a/410b opposite to the internal edge thereof. Specifically, a notch 502a/502b is defined on each of the couple of end plates 520a/520b of the air shroud 500, the respective notches 502a/502b are arranged respectively corresponding to two ends of the respective slot connectors 400 in the air shroud 500. An elastic hook 541a/541b is extended from an internal edge of each notch 502a/502b, the elastic hook 541a/541b is reversed into the air shroud 500, and a tip of the elastic hook 541a/541b penetrates out the air shroud 500 from inside thereof and fixed thereby, and a middle segment of the elastic hook 541a/541b is folded to form a protrusion for hooking the latch 410a/410b.

An elastic hook 542 is arranged protruding from an internal surface of one of the side plates 530a of the air shroud 500, and the elastic hook 542 hooks an edge of the tray 100. Specifically, an elastic hook 542 is arranged protruding from an edge of the side plate 530a, the elastic hook 542 is reversed into the air shroud 500, and a tip of the elastic hook 541a/541b penetrates out the air shroud 500 from inside thereof and fixed thereby, and a tip of the elastic hook 542 hooks the side wall 110 of the tray 100. Preferably, according to FIG. 5, a reversed portion 111 is inward reversed from a top edge of the side wall 110 of the tray 100 and the tip of the elastic hook 542 is allowed to hook therewith. The other side plate 530b is inserted between the computing device 300 and the adjacent slot connector 400 and the computing device 300 is thereby separated from the slot connector 400. Specifically, the heat dissipation block 310 surrounding the computing device 300 is separated from adjacent slot connectors 400 by the side plate 530b, and the side plate 530b is attached on the heat dissipation block 310. Preferably, a slot connector 400 is arranged at each of two sides of the computing device 300, and an air shroud 500 is correspondingly arranged at each of two sides of the computing device 300, with an air channel extending to the computing device 300 as defined by the side plates 530b of the couple of air shrouds 500.

Figure 2:
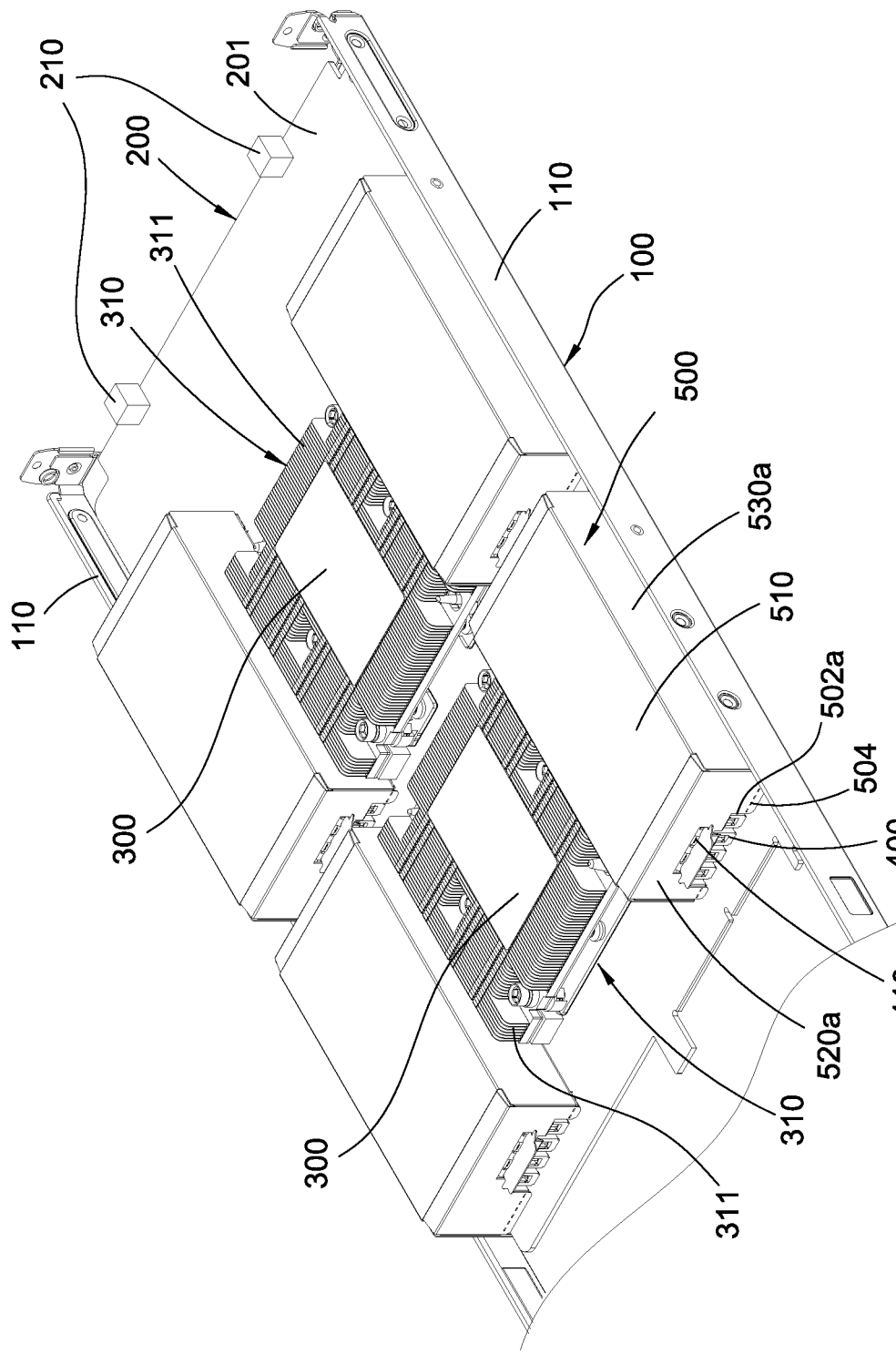
FIG. 2 is a perspective view showing the server structure according to the embodiment of the present disclosure.
Figure 3:
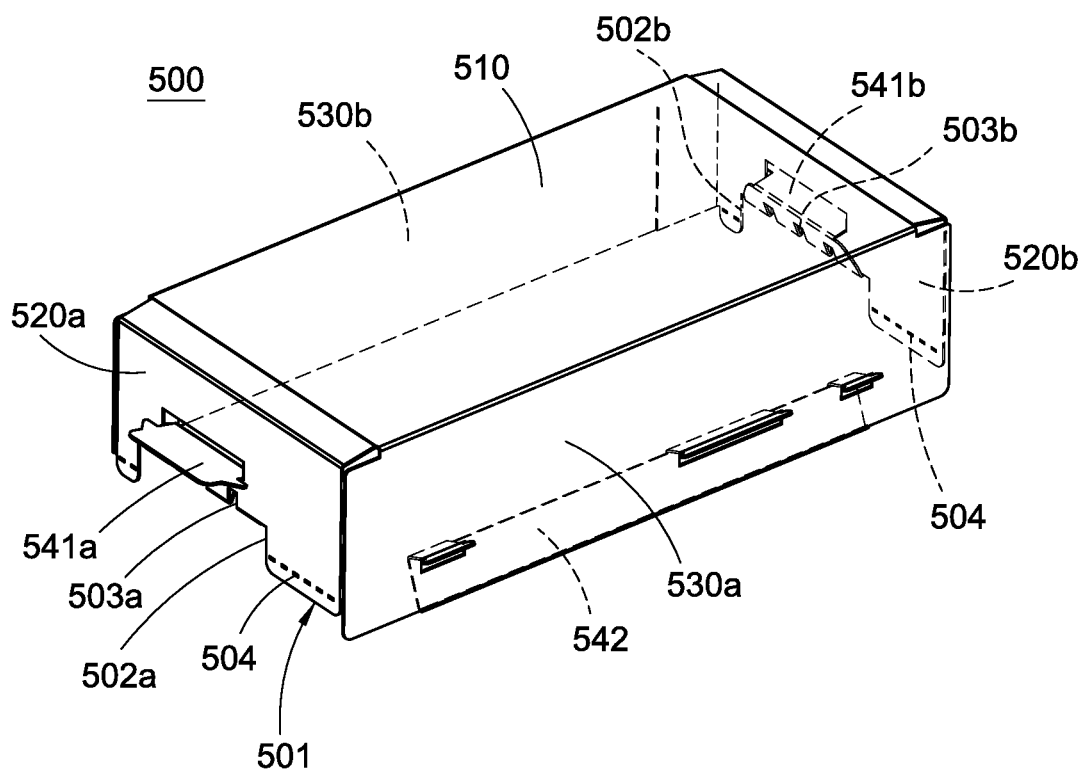
FIGS. 3 and 4 are exploded views showing the air shroud of the server structure according to the embodiment of the present disclosure.
Figure 4:
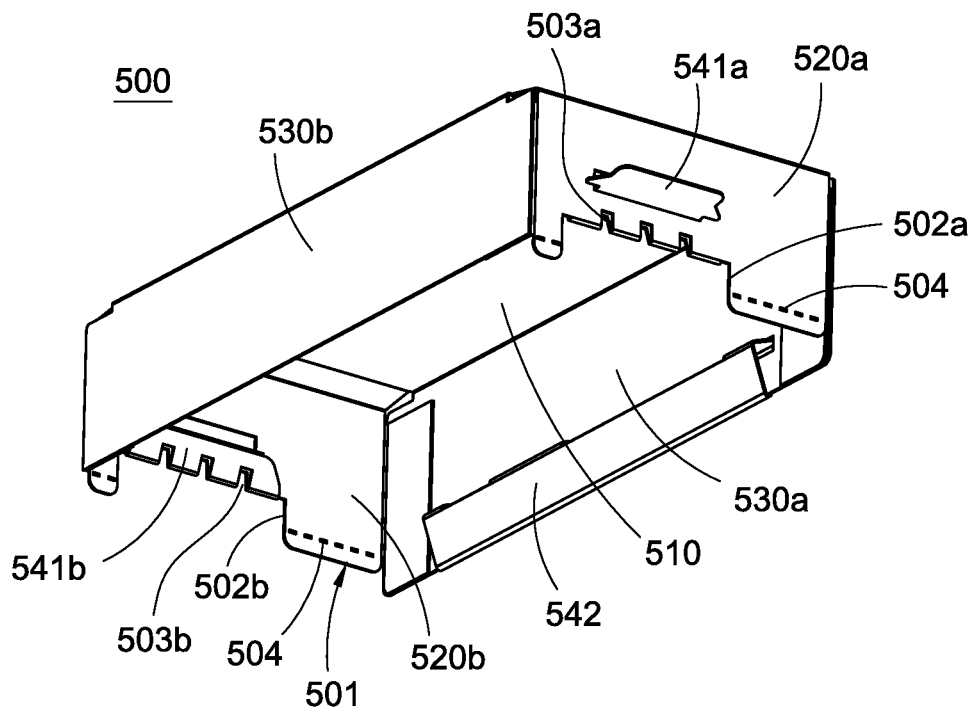
Figure 5:
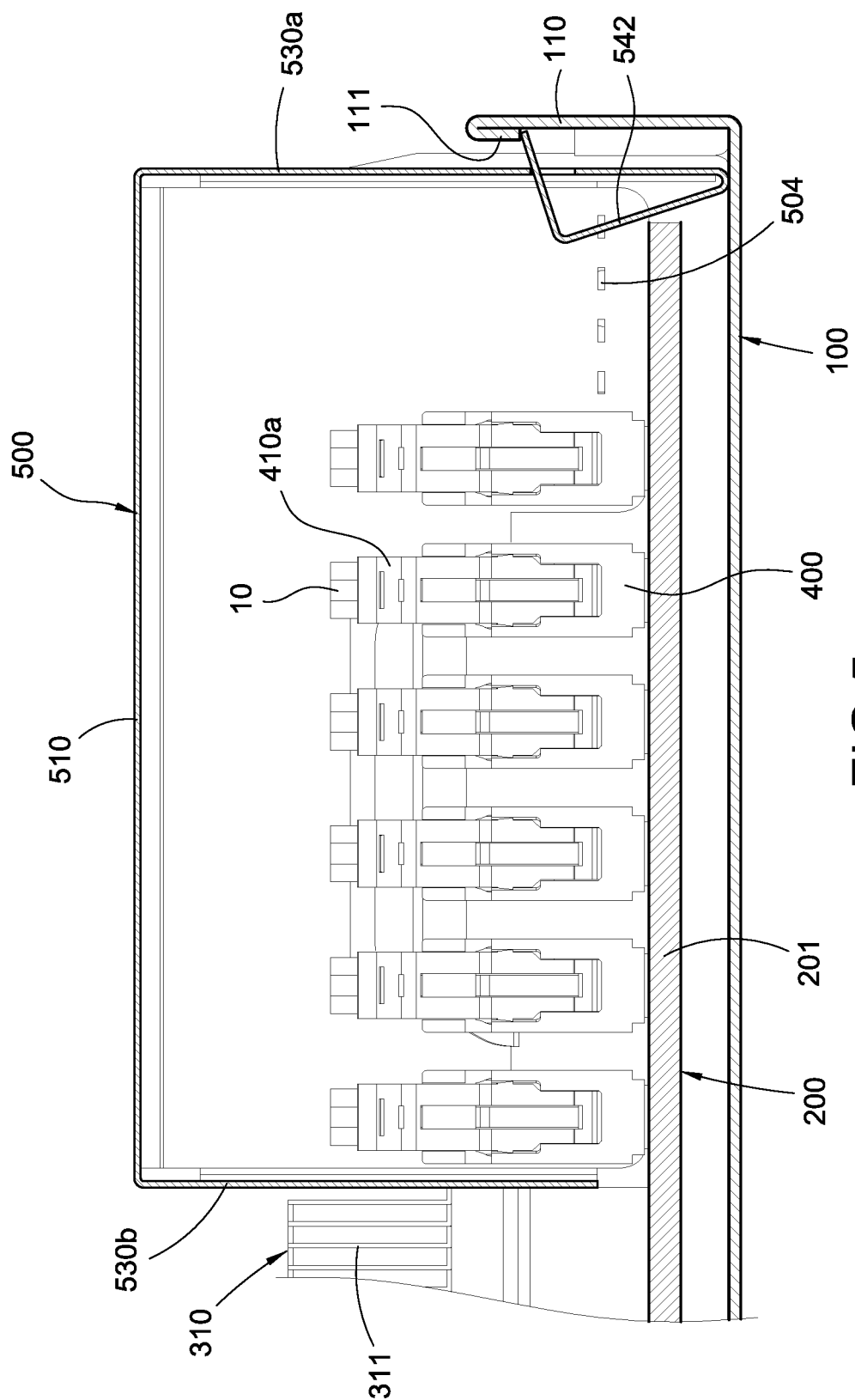
FIGS. 5 and 6 are schematic views showing the arrangement of the air shroud of the server structure according to the embodiment of the present disclosure.
Figure 6:
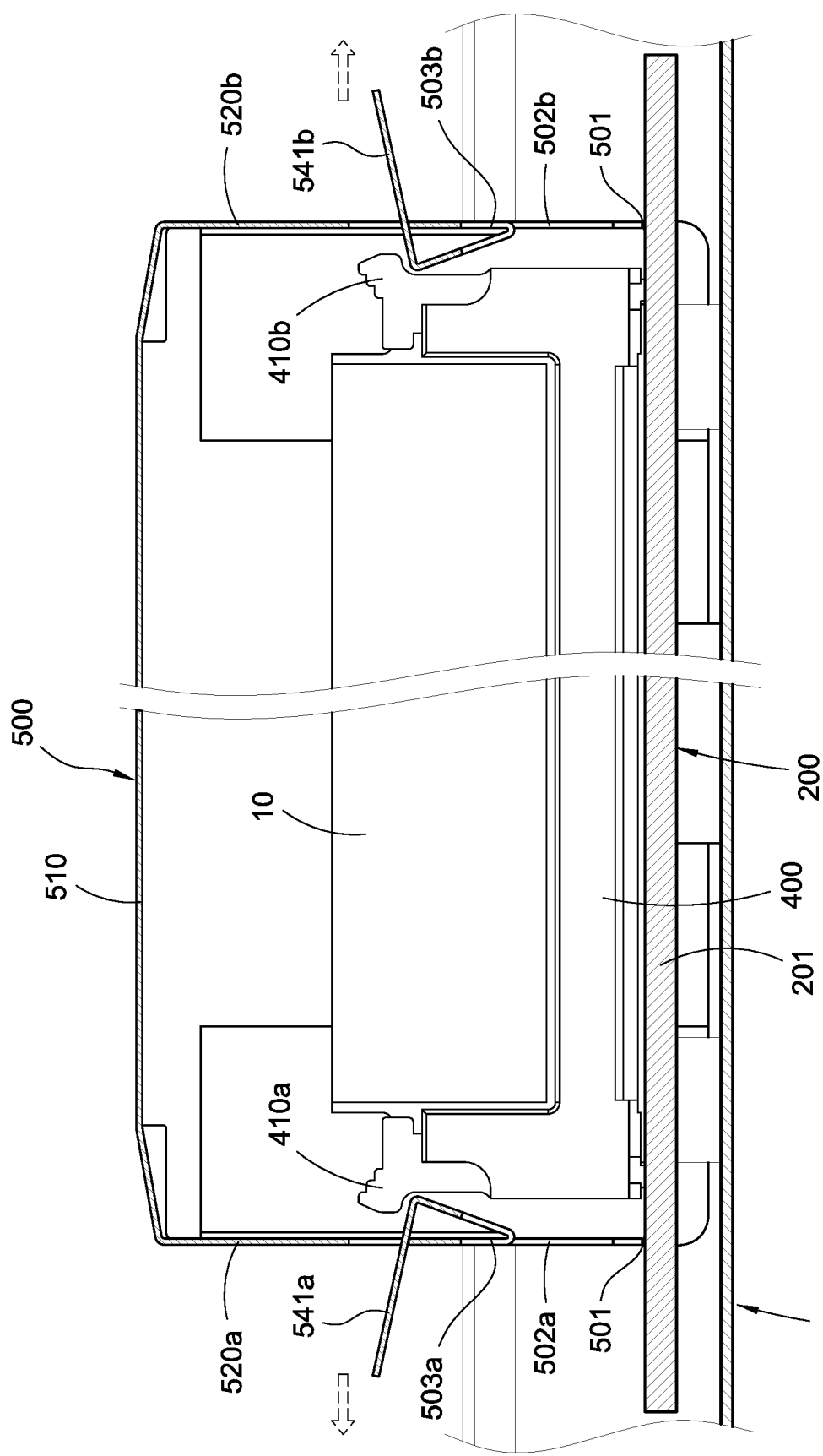

According to FIGS. 2 and 6, at least one slot 503a/503b is defined at an edge of each notch 502a/502b, and the slots 503a/503b are disposed corresponding to gaps between some of the adjacent slot connectors 400 in the air shroud 500. Therefore, according to the present embodiment, a plurality of slots 503a/503b are defined at the edge of each notch 502a/502b, the respective slot 503a/503b are extended to the elastic hook 541a/541b. Thereby, some bypass airflow is allowed to flow through the gaps between the adjacent slot connectors 400 and exchange heat with the slot connectors 400.

According to FIGS. 3 to 6, the air shroud 500 is fixed by three elastic hooks 541a/541b/542 and thereby easy to be installed. One of the side plates 530a of the air shroud 500 is supported on the top surface 201 of the mother board 200, the other side plate 530b of the air shroud 500 supports on an internal bottom of the tray 100. A broken line 504 is defined on a tip of each of the two end plates 520a/520b of the air shroud 500 and thereby allowed to be selectively placed according to a level difference between the tray 100 and the mother board 200. According to FIG. 6, when a user disassembles the air shroud 500, the tip of each elastic hook 541a/541b outward protruding on each end plate 520a/520b is pulled outward, the middle segments of the respective elastic hooks 541a/541b are thereby moved outward to leave the respective corresponding latches 410a/410b, and the slot connectors 400 are thereby released. Then, the side plates 530b attached on the heat dissipation block 310 are moved upward, the opposite elastic hook 542 hooking the reversed portion 111 on the tray 100 side wall 110 is therefore allowed to leave the reversed portion 111 along a direction perpendicular to this side wall 110, and the air shroud 500 is thereby disassembled.

According to the server structure of the present disclosure, the air shrouds 500 cover the slot connectors 400 to prevent airflow from flowing through the slot connector 400, and the airflow thereby flows together and through a primary heat source, such as the computing device 300. Namely, the air shroud 500 prevents the airflow from flowing through the electronic components generating less heat, such as the extension card 10, but the airflow is thereby guided to flow together and through the primary heat source, i.e., the computing device 300, and an efficiency of heat dissipation of the computing device 300 is thereby ensured. The air shroud 500 has simple structures, and the air shrouds 500 separated from each other could be disposed according to various electronic components. It is not necessary to bypass other existing components, as the present disclosure is adapted to limited spaces and various arrangements of components, and structure of the present disclosure is simple. According to the server structure of the present disclosure, the air shroud 500 is formed by a folded insulation plastic sheet, and it is therefore low cost, easy to be manufactured and insulative.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the present disclosure as defined in the appended claims.

What is claimed is:

1. A server structure, comprising:
   a tray;
   a mother board stacked on the tray, and a top surface of the mother board being exposed;
   a computing device arranged on the top surface of the mother board and electrically connected to the mother board;
   a plurality of slot connectors arranged on the top surface of the mother board and arranged in parallel and at intervals, and the slot connectors being arranged adjacent to the computing device; and
   an air shroud covering on the slot connectors,
   wherein the air shroud comprises a rectangular top plate and comprises a couple of end plates and a couple of side plates respectively arranged perpendicular to the rectangular top plate, the couple of end plates and the couple of side plates are connected to the respectively edges of the top plate, the couple of end plates are arranged opposite to each other and the couple of side plates are arranged opposite to each other, an opening opposite to the top plate is enclosed among the couple of end plates and the couple of side plates, and the slot connectors are accommodated in the opening;
   wherein an elastic hook is protruded from an internal surface of each of the couple of end plates, a latch is arranged on each of two ends of each slot connector, and the elastic hook hooks the respective latches.

2. A server structure, comprising:
   a tray;
   a mother board stacked on the tray, and a top surface of the mother board being exposed;
   a computing device arranged on the top surface of the mother board and electrically connected to the mother board;
   a plurality of slot connectors arranged on the top surface of the mother board and arranged in parallel and at intervals, and the slot connectors being arranged adjacent to the computing device; and
   an air shroud covering on the slot connectors,
   wherein the air shroud comprises a rectangular top plate and comprises a couple of end plates and a couple of side plates respectively arranged perpendicular to the rectangular top plate, the couple of end plates and the couple of side plates are connected to the respectively edges of the top plate, the couple of end plates are arranged opposite to each other and the couple of side plates are arranged opposite to each other, an opening opposite to the top plate is enclosed among the couple of end plates and the couple of side plates, and the slot connectors are accommodated in the opening;

wherein an elastic hook is arranged protruding from an internal surface of one of the side plates, and the elastic hook hooks an edge of the mother board.

3. The server structure according to claim 2, wherein the elastic hook is reversed and extended from an edge of the side plate, a tip of the elastic hook penetrates and hooks the side plate, and the tip of the elastic hook hooks a side wall of the tray.

4. The server structure according to claim 2, wherein the slot connectors are separated from the computing device by the other side plate.

5. The server structure according to claim 1, wherein a notch is defined on each of the couple of end plates of the air shrouds, and the respective notches are arranged correspondingly to the two ends of the respective slot connectors.

6. The server structure according to claim 5, wherein the elastic hook is reversed and extended from an internal edge of the notch, a tip of the elastic hook penetrates and hooks the side plate, and a middle segment of the elastic hook hooks the respective connectors.

7. The server structure according to claim 5, wherein at least one slot is defined on an edge of each notch, the slots are disposed corresponding to gaps between the adjacent slot connectors, an elastic hook is arranged protruding from an internal surface of each of the couple of end plates, a latch is arranged on each of two ends of each slot connector, the elastic hook hooks the respective latches, and each slot extends to the elastic hook.

8. The server structure according to claim 1, wherein a heat dissipation block thermally connected with the computing device is arranged on the mother board, the heat dissipation block comprises a plurality of fins arranged in parallel and at intervals, and the fins are arranged parallel with the slot connectors.

9. The server structure according to claim 1, wherein the respective slot connectors are arranged at two opposite sides of the computing device, there are two air shrouds respectively arranged at the two opposite sides of the computing device corresponding to the slot connectors, and an air channel extended to the computing device is defined in a space enclosed between the two air shrouds.

* * * * *